United States Patent [19]

Palagonia

[11] Patent Number: 5,895,978
[45] Date of Patent: Apr. 20, 1999

[54] HIGH DENSITY SIGNAL MULTIPLEXING INTERPOSER

[75] Inventor: Anthony Michael Palagonia, Underhill, Vt.

[73] Assignee: International Business Machines Corporation, Armonk, N.Y.

[21] Appl. No.: 08/832,405

[22] Filed: Apr. 2, 1997

[51] Int. Cl.$^6$ .......................... H01L 23/48; H01L 23/52; H01L 29/40

[52] U.S. Cl. .................. 257/786; 257/678; 257/698

[58] Field of Search .................. 257/678, 786, 257/698

[56] References Cited

U.S. PATENT DOCUMENTS 5,382,827  1/1995  Wang et al. .................. 257/528
5,502,333  3/1996  Bertin et al. .................. 257/685
5,517,515  5/1996  Spall et al. .................. 371/22.5

*Primary Examiner*—Teresa M. Arroyo
*Attorney, Agent, or Firm*—Robert A. Walsh

[57] ABSTRACT

A high density and high I/O count packaging methodology and associated fabrication technique is presented. A semiconductor die having logic circuits for multiplexing specified sets of I/O logic is electrically connected to an interposer having semiconductor logic circuits for multiplexing selected sets of module pins to allow a reduced number of I/O pads on the die and matching interconnect pads on the interposer. The interposer connects the reduced number of die I/O pads to a higher number of module pins corresponding to the number of I/O functions on the die. The interposer is fabricated from a semiconductor substrate using standard semiconductor processes and materials.

15 Claims, 4 Drawing Sheets ns as well as to provide wire crossover capability. According to one embodiment the interposer is arranged with peripheral pads. In a another embodiment the interposer uses with array pads.

An object of this invention is to provide a packaging methodology that can support high I/O counts in small area dies. Another object of this invention to provide a methodology for multiplexing semiconductor die I/O signals within a semiconductor module. A further object of the invention is to form an interposer from a silicon substrate which itself is incorporated into a semiconductor module.

HIGH DENSITY SIGNAL MULTIPLEXING INTERPOSER

FIELD OF THE INVENTION

The present invention relates to the field of packaging high density semiconductor dies; and more specifically, it relates to a method for providing signal input and output using pin counts significantly lower than the number of input and output signals of the semiconductor die.

BACKGROUND OF THE INVENTION

As the number of input and output (I/O) signals increases there will be a point where conventional packages, including multilevel ceramic (MLC) packages can not provide enough output pads within the footprint of the die or especially wire paths on the packaging substrate under the die footprint.

I/Os can be distributed on a die in two ways, along the periphery of the die in one or several rings of pads or throughout the surface area of the die in an array of pads. Dies using pad periphery layouts encounter space limitations at lower counts than pad array layouts. Given a 5 mm die with 100 micron pads on 200 micron centers only about 100 peripheral pads can be laid out but over 600 array pads. For a 20 mm die the number of pads are about 600 and 10,000 respectively. Moving from peripheral pad layouts to array pad layouts forestalls this problem somewhat. However pad array layouts require more complex and costly fabrication techniques invariably involving solder ball interconnection. Further as semiconductor technology results in further density increases resulting in decreasing die size and increasing I/O count even the pad size and spacing on array pad layouts must decrease. For example, a 10,000 I/O count on a 5 mm die would require pads of 25 micron on 50 micron centers. At such small pad sizes the cost and complexity of interconnect processing are not insignificant.

Wiring density on the surface of the package substrates has lead to the use of multi-level ceramic modules. However layer counts can increase extremely fast and when multi chip modules (MCM) are considered the difficulty of packaging wire density increases even more.

Finally the size and density of the wires or lands on the surface and within the layers of the packaging substrate is limited, such that, problems with resistance, capacitance, and delay issues arise.

SUMMARY OF THE INVENTION

The present invention comprises a module comprising an interposer having semiconductor logic disposed therein. At least one semiconductor die is electrically connected to the interposer. The purpose of the logic is to multiplex specified sets of I/O pads to a single transmission line connected to a single die pad. Further the die has semiconductor logic disposed therein for the purpose of multiplexing specified sets of die I/O function to a single die pad. Further clocking and control signals are passed between the interposer multiplexing logic and the die multiplexing logic. The entire multiplexing system is bidirectional so signals can pass both from the die to the pads or pins of the module and from the pads or pins of the module to the die.

The interposer is formed using standard semiconductor processes and materials. The structure would include several levels. In the silicon the active devices would be fabricated and circuits formed at a first level of wiring. At least one or two additional, wiring levels are required to interconnect the circuits to the interconnect pads and the interposer pads or

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
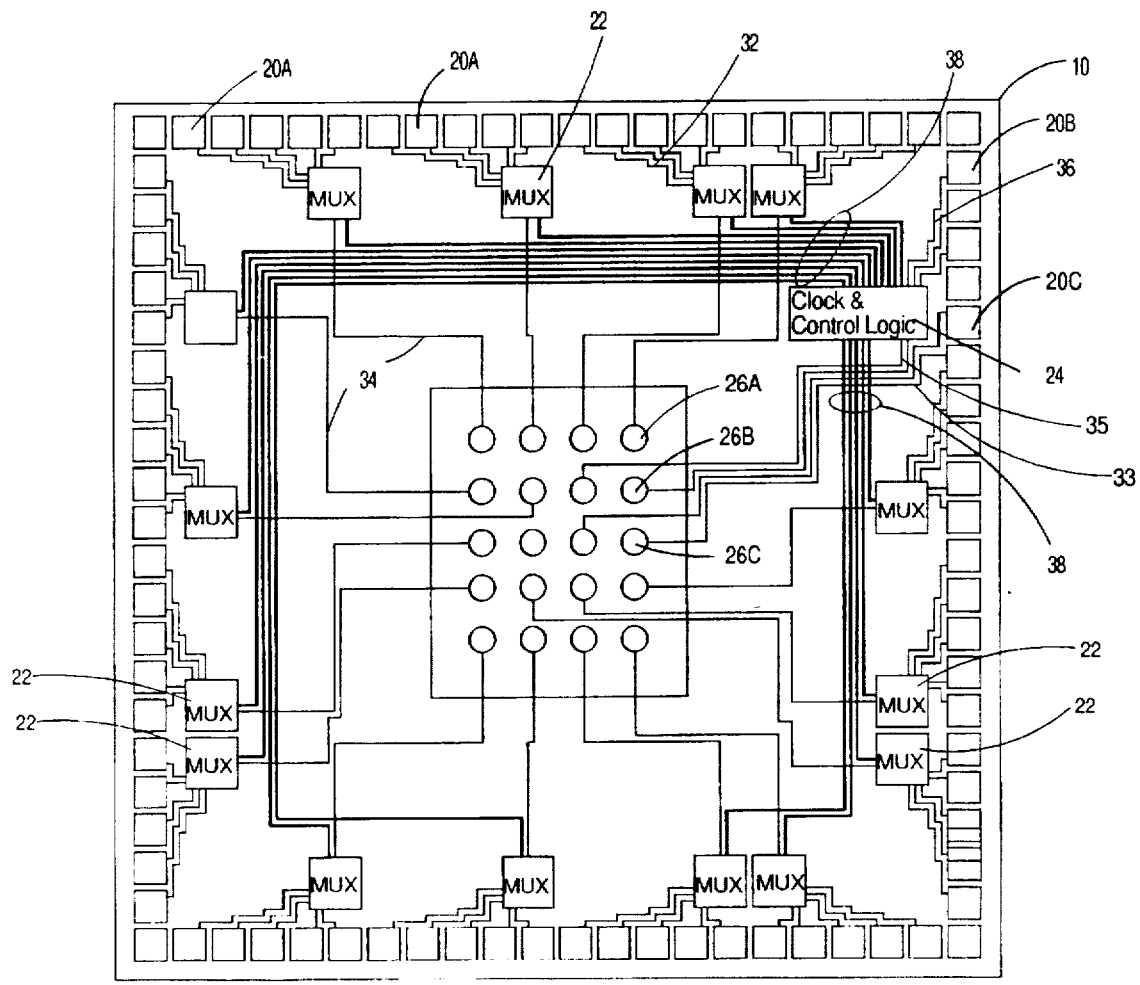
FIG. 1 is a diagrammatic plan view of the layout of the interposer in accordance with the preferred embodiment.

In FIG. 1 a diagrammatic representation of the layout of an interposer of the present invention is shown. It should be kept in mind that the interposer contains silicon active devices and circuits which may be fabricated with identical processes, materials and specifications as used for conventional semiconductor circuits, devices and dies. In this way the active circuits may be produced in the interposer of the present invention. The pads and lands may be similarly formed, though usually thicker and wider than those used for interconnecting the active devices into circuits. Interposer 10 has interposer pads 20A and 20B dispersed around the periphery of the interposer. Though one ring is shown, multiple rings may be envisioned and implemented. Interposer pads 20A are I/O function pads arranged in sets and connected to interposer multiplexers, MUX's 22 by lands 32. Five pads are shown by way of example connected to each interposer MUX however fewer or greater may be used as designers choice. Because multiplexing signals must yield a resultant signal delay, the limit to the number of pads that can be connected is determined by the overall signal delay any particular die function can tolerate. There is no reason that all MUX's must combine the same number of functions so MUX's of different number of I/O's are envisaged. This would act to mitigate the general delay concern as well. Pads 26A, 26B and 26C are interconnect pads to connect the die to the interposer through an appropriate means such as solder ball or wirebond may be used for example. Each interposer MUX 22 in turn is wired to a interconnect pad 26A by a land 34. Interposer pads 20B provide external clock and control signal access to interposer clock and control logic 24 by lands 36. Lands 35 carry clock and control signals from interposer clock and control logic 24 to interconnect pads 26B. Multi wire bus 38 carries clock and control signals to interposer MUX's 22. Power supply interposer pads 20C are connected by lands 33 to interconnect pads 26C.

Figure 2:
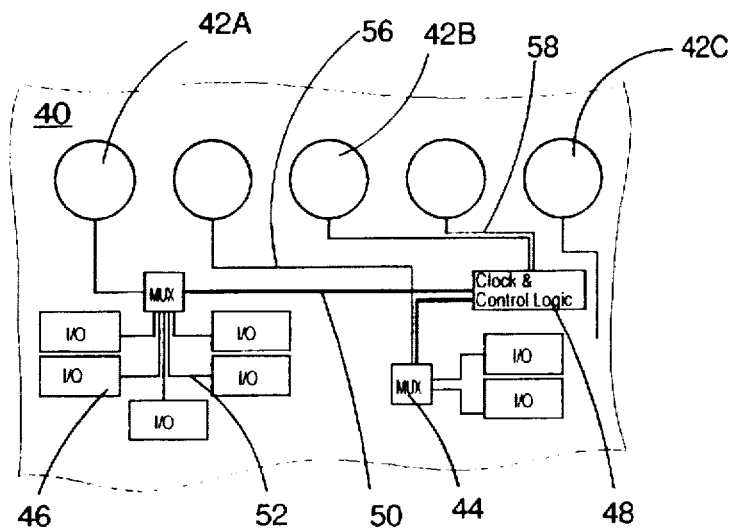
FIG. 2 is a diagrammatic view of a portion of a semiconductor die that mates with the interposer.

FIG. 2 shows a portion of the semiconductor die 40 intended to be connected to interposer 10. Die pads 42A are connected through lands 56 to die MUX's 44. Multiple die having I/O functions 46 each producing an I/O signal are connected to die MUX's 44 by lands 52. Die pads 42B are connected through lands 58 to die MUX clock and control logic 48. Multi wire bus 50 carries clock and control signals to die MUX's 52. Die pads 42C carry power to die. Die pads 42A will be connected to interconnect pads 26A and die pads 42B will be connected to interconnect pads 26B when the die 40 is attached to interposer 10 shown in FIG. 1. Likewise, die pads 42C will be connected to interconnect pads 26C.

Figure 3:
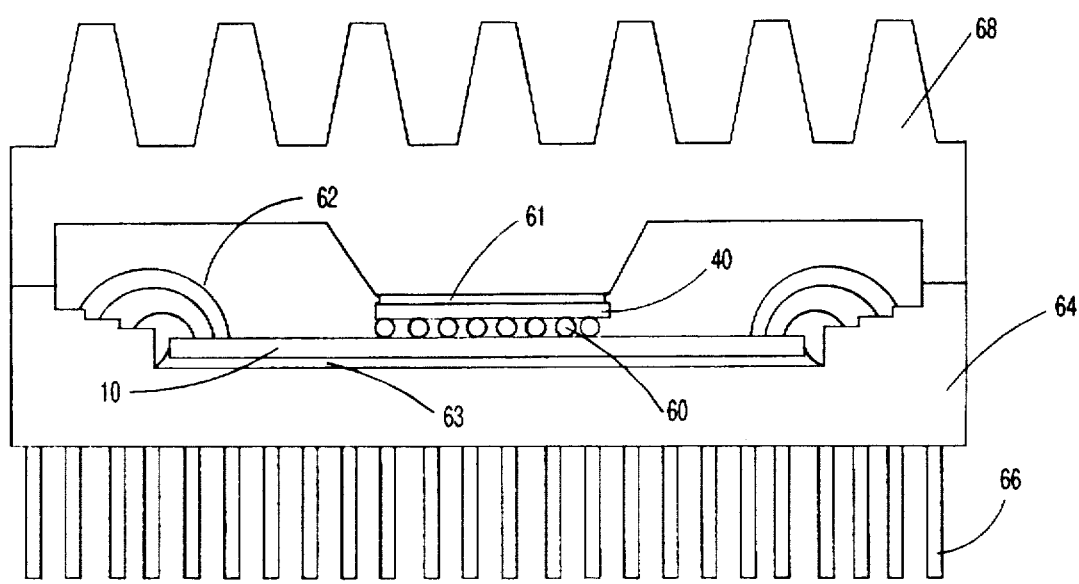
FIG. 3 is a side, sectioned view of the die and interposer mounted in a package.

Attention is now directed to FIG. 3 which shows die 40 connected to interposer 10 by solder balls 60. When the term solder ball is used generically for any type of ball connection such as, C4 interconnect or C4 ball. The interposer/die combination is shown assembled in a pin grid array package that is well known in the semiconductor field having pins 66 for connection to the next level of assembly. Interposer 10 maybe a multi layer ceramic 64 with epoxy 63 with a heat sink 68 placed in thermal contact with die 40 via thermal grease 61. Wirebonds 62 connect interposer 10 to Multi-Layer Ceramic (MLC) 64.

Figure 4:
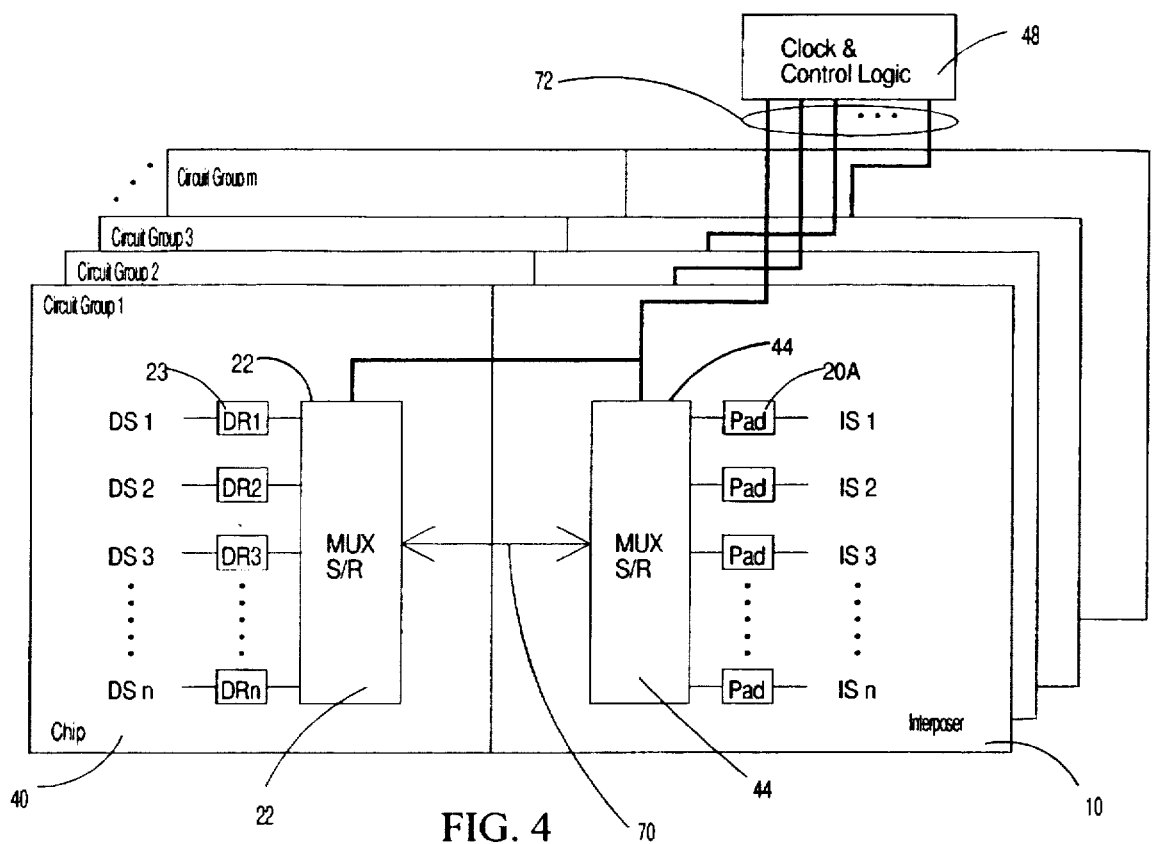
FIG. 4 is a diagram of the circuit architecture of the interposer/semiconductor die combination.
Figure 5:
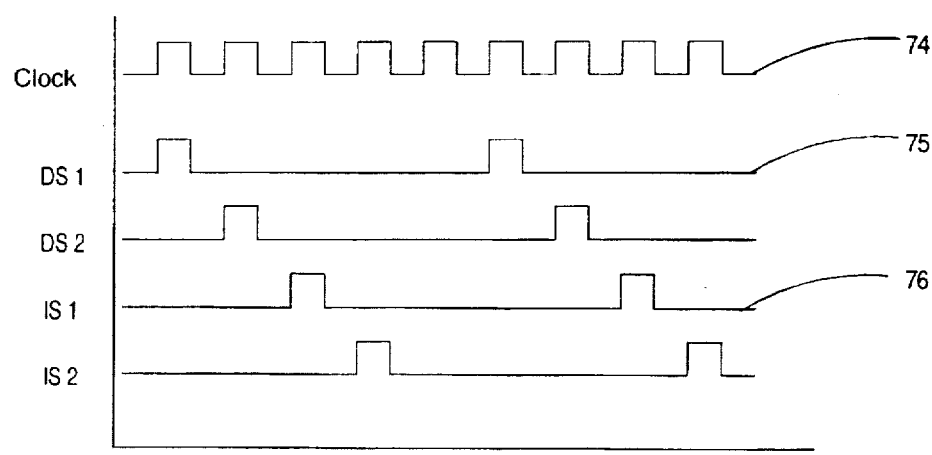
FIG. 5 is a timing diagram of the operation of the interposer/semiconductor die combination.

FIG. 4 shows a diagram of the circuit architecture of the interposer/semiconductor die combination and FIG. 5 shows a timing diagram of the operation of the interposer/semiconductor die combination. Clock and control logic 48 sends pulsed signal 74 through bus 72 to all interposer MUX's 44 and die MUX's 22 in order to synchronize their operation. Die signals 75 from input/output drivers 23 are delivered to die MUX 22 and stored. Similarly external signals 76 from interposer pads 20A are delivered to interposer MUX 44. Transmission line 70 interconnects die MUX 22 to interposer MUX 70. While transmission line 70 is preferably a single line, multiple lines could be allowed as long as the number of lines is kept small compared to the number of functions to be multiplexed together. Each MUX has latch and control circuits to capture data and logic functions to release data to transmission line 70 in a predetermined order. Control signals in bus 72 are used to set, coordinate set and control of each MUX. The clock signal 74 provides for synchronous control of the system, although asynchronous operation would still be within the spirit of the present invention. This clock and the accompanying MUX control signals can be generated in three places, externally, on the interposer, or on the die, in which case the clock could be a standard die clock or a special die/interposer clock. An implementation of the clock and die/interposer MUX control on the interposer is preferred for reasons of testability, ease of fabrication and inventory cost.

It is contemplated that each MUX contains the necessary storage latches, send/receive circuits, and driver circuits. The interposer MUX's could optionally include mixed voltage drivers and Electro-Static Discharge (ESD) protection eliminating the need to have these functions on the die.

Additionally the single bi-directional interface between the interposer and die multiplexer's could be a multiple wire interface allowing simultaneous sending and receiving, though this would increase the pad counts required.

The circuit operation has been described in terms of sequentially sending the I/O signals. Another method would be to send a string of data pulses giving I/O address bits and data bits that would be decoded at the receiving end of the transmission and route the proper signal to the proper interposer I/O pad or chip I/O receiver.

Circuit requirements to implement the invention are the same as conventional for logic and memory circuit design which are well known in the semiconductor field. Incorporation of boundary scan, and pass thru test modes may likewise easily implemented for testability.

Figure 6:
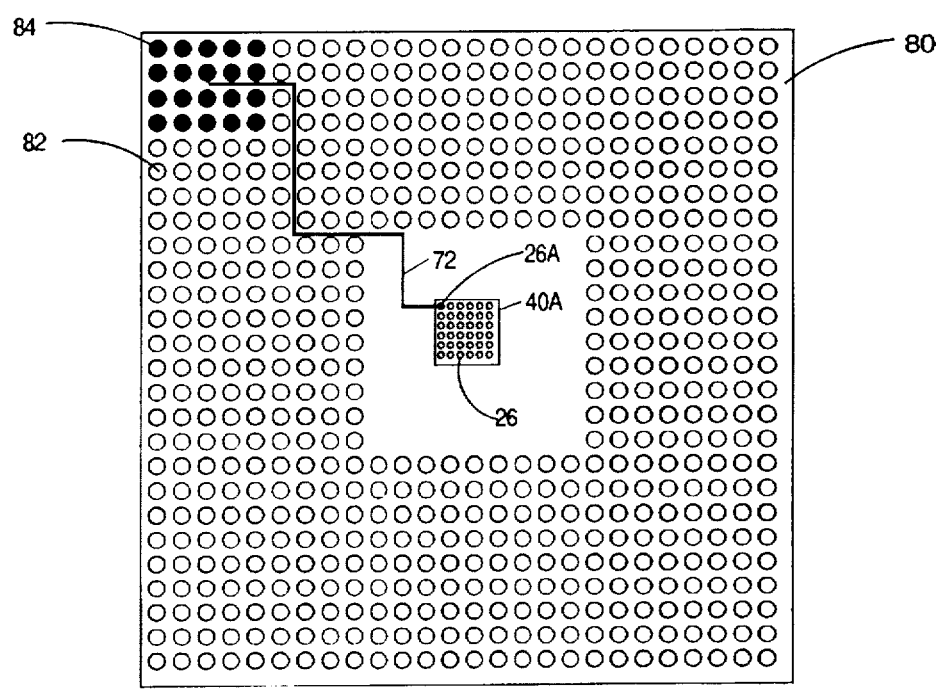
FIG. 6 is a plan view of a array pad embodiment of the interposer in accordance with the present invention.
Figure 7:
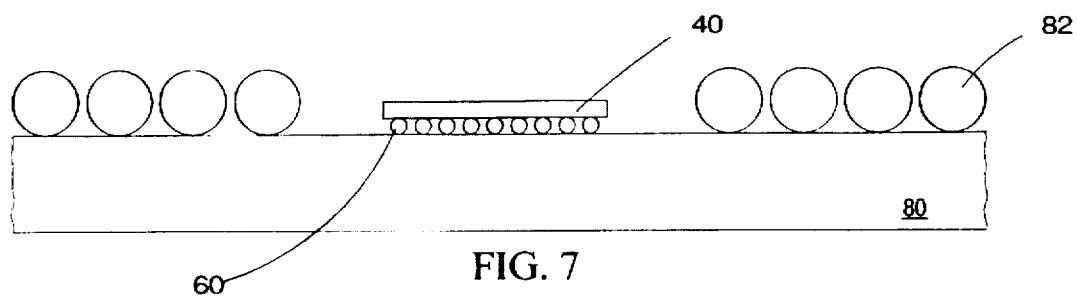
FIG. 7 is a side, sectioned view of a solder ball array embodiment of the interposer according to the present invention.
Figure 8:
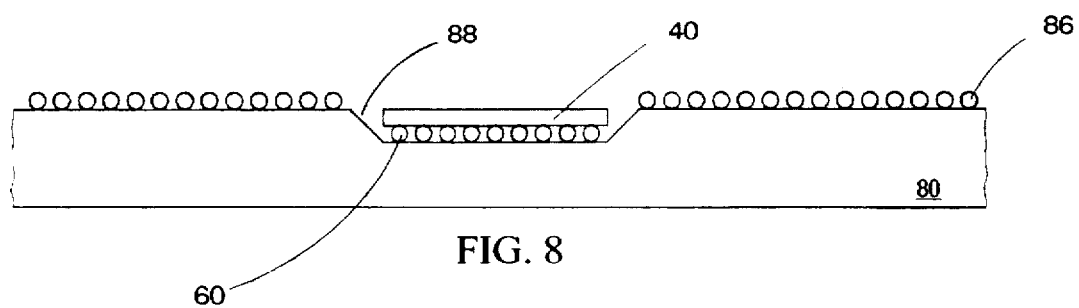
FIG. 8 is a side, sectioned view of a ball grid array embodiment of the interposer according to the present invention.

Attention is now directed to other methods of interconnection to the next level of assembly of which FIGS. 6, 7 and 8 are illustrative. In FIG. 6 interposer 80 is shown as having a ball grid array comprised of individual solder balls 82. 40A is the site for attachment of die 40. A group of solder balls 84 are multiplexed and connected by land 72 to interconnect pad 26A. FIG. 7 shows die 40 attached to interposer 80 by solder balls (C4 type) 60. In FIG. 8 the ball grid array of the interposer of FIG. 7 has been replaced with a solder ball (C4) array 86. The main difference between C4 and Ball Grid Array (BGA) is size, height, and reflow temperature. Because of the height similarity the interposer in FIG. 8 has a recess 88 formed to receive die 40. Since the interposer is comprised of silicon, any number of Reactive Ion Etch (RIE) or strongly basic wet etches could be used to form this recess.

The description of the invention has focused on multiplexing I/O signals on the die pad and processing these signals so that they are decoded/de-multiplexed and presented on the interposer pins. It should also be understood that the system may also receive I/O signals on the interposer pins which are multiplexed and decoded/de-multiplexed and presented on the die pad.

While the invention has been described in terms of a single die, it would be a simple matter to extend the scope of the invention to provide for multiple dies on the same interposer forming the basis of another form of a multi chip module.

The description of the embodiments of the present invention is given above for the understanding of the present invention. It will be understood that the invention is not to be limited to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A semiconductor device which includes a semiconductor die having a plurality of I/O pads, comprising:

a first circuit means included on the die for combining predetermined I/O signals into a set of sequential I/O signals that are presented at one of the plurality of die I/O pads; and means for connecting said die I/O pads to a plurality of interconnect pads disposed on a semiconductor interposer having interposer I/O pads, said interconnect pads electrically coupled through a second circuit means for converting said set of sequential I/O signals back to the predetermined I/O signals such that each predetermined I/O signal is presented at one of the interposer I/O pads.

2. The semiconductor device of claim 1, wherein said first and second circuit means are bidirectional, and are synchronized by a clock pulse.

3. The semiconductor device of claim 2, wherein said first and second circuit means include multiplexers and latch elements which store received I/O signals.

4. The semiconductor device of claim 3, wherein said sequential I/O signals comprise data bits and address bits.

5. The semiconductor device of claim 4, wherein said means for connecting said die I/O pads to a plurality of interconnect pads comprises solder ball connections.

6. A semiconductor device which includes a semiconductor die having a plurality of I/O pads, comprising:

a first circuit means included on the die for combining predetermined I/O signals into a set of sequential I/O signals that are presented at one of the plurality of die I/O pads;

means for connecting said die I/O pads to a plurality of interconnect pads disposed on a semiconductor interposer having interposer I/O pads, said interconnect pads electrically coupled through a second circuit means for converting said set of sequential I/O signals back to the predetermined I/O signals such that each predetermined I/O signal is presented at one of the interposer I/O pads; and wirebond means for connecting said interposer I/O pads to module I/O pins.

7. The semiconductor device of claim 6, wherein said first and second circuit means are bi-directional, and are synchronized by a clock pulse.

8. The semiconductor device of claim 7, wherein said first and second circuit means include multiplexers and latch elements which store received I/O signals.

9. The semiconductor device of claim 8, wherein said sequential I/O signals comprise data bits and address bits.

10. The semiconductor device of claim 9, wherein said means for connecting said die I/O pads to a plurality of interconnect pads comprises solder ball connections.

11. A semiconductor device which includes a semiconductor die having a plurality of I/O pads, comprising:

a first circuit means included on the die for combining predetermined I/O signals into a set of sequential I/O signals that are presented at one of the plurality of die I/O pads;

means for connecting said die I/O pads to a plurality of interconnect pads disposed on a semiconductor interposer having interposer I/O pads, said interconnect pads electrically coupled through a second circuit means for converting said set of sequential I/O signals back to the predetermined I/O signals such that each predetermined I/O signal is presented at one of the interposer I/O pads; and solder ball means for connecting said interposer I/O pads to module I/O pins.

12. The semiconductor device of claim 11, wherein said first and second circuit means are bi-directional, and are synchronized by a clock pulse.

13. The semiconductor device of claim 12, wherein said first and second circuit means include multiplexers and latch elements which store received I/O signals.

14. The semiconductor device of claim 13, wherein said sequential I/O signals comprise data bits and address bits.

15. The semiconductor device of claim 14, wherein said means for connecting said die I/O pads to a plurality of interconnect pads comprises solder ball connections.

* * * * *